United States Patent
Han et al.

(10) Patent No.: US 11,851,588 B2
(45) Date of Patent: Dec. 26, 2023

(54) ADHESIVE TAPE AND METHOD OF MANUFACTURING THEREOF

(71) Applicant: LG Chem, Ltd., Seoul (KR)

(72) Inventors: Jeong-In Han, Daejeon (KR); Won-Gu Choi, Daejeon (KR); Jang-Soon Kim, Daejeon (KR); Tae-Yi Choi, Gyeonggi-do (KR); Ji-Yeon Yang, Daejeon (KR); Dan-A Kim, Gyeonggi-do (KR); Seo-Hyeon Park, Gyeonggi-do (KR)

(73) Assignee: LG Chem, Ltd.

( * ) Notice: Subject to any disclaimer, the term of this patent is extended or adjusted under 35 U.S.C. 154(b) by 345 days.

(21) Appl. No.: 15/568,971

(22) PCT Filed: Feb. 23, 2017

(86) PCT No.: PCT/KR2017/002013
§ 371 (c)(1),
(2) Date: Oct. 24, 2017

(87) PCT Pub. No.: WO2017/146492
PCT Pub. Date: Aug. 31, 2017

(65) Prior Publication Data
US 2018/0127624 A1 May 10, 2018

(30) Foreign Application Priority Data
Feb. 23, 2016 (KR) .................. 10-2016-0021422

(51) Int. Cl.
*C09J 133/08* (2006.01)
*C09J 7/21* (2018.01)
(Continued)

(52) U.S. Cl.
CPC ............ *C09J 133/08* (2013.01); *B65D 5/708* (2013.01); *C09J 5/06* (2013.01); *C09J 5/08* (2013.01);
(Continued)

(58) Field of Classification Search
None
See application file for complete search history.

(56) References Cited

U.S. PATENT DOCUMENTS 4,163,822 A 8/1979 Walter
4,908,403 A * 3/1990 Spada .................. C08F 220/12
524/818

(Continued)

FOREIGN PATENT DOCUMENTS

CN 104922721 A 9/2015
CN 107109167 A 8/2017
(Continued)

OTHER PUBLICATIONS

Adhesives, Paper Conservation Catalog Sixth Edition, The American Institute for Conservation of Historic and Artistic Works Book and Paper Group, Oct. 1989.*
(Continued)

*Primary Examiner* — Alicia Chevalier
*Assistant Examiner* — Elaine M Vazquez
(74) *Attorney, Agent, or Firm* — Lerner David LLP

(57) ABSTRACT

The present invention provides an adhesive tape including: a base material; and an adhesive sheet provided on one surface of the base material and including cured products of an aqueous acrylic adhesive composition, in which the adhesive sheet has a porous structure including pores, and wherein the adhesive tape has a water vapor transmission rate of 3,000 g/m²·day or more and 5,000 g/m²·day or less
(Continued)

under conditions of a temperature of 40° C. and a relative humidity of 20%, and a method for manufacturing the same.

14 Claims, 1 Drawing Sheet

(51) Int. Cl.
    *C09J 7/38*     (2018.01)
    *C09J 7/20*     (2018.01)
    *C09J 5/08*     (2006.01)
    *C09J 5/06*     (2006.01)
    *B65D 5/70*     (2006.01)
    *C09J 125/14*     (2006.01)
    *H01L 21/683*     (2006.01)

(52) U.S. Cl.
    CPC . *C09J 7/20* (2018.01); *C09J 7/21* (2018.01); *C09J 7/385* (2018.01); *C09J 125/14* (2013.01); *H01L 21/6835* (2013.01); *C09J 2301/00* (2020.08); *C09J 2400/24* (2013.01); *C09J 2433/00* (2013.01)

(56) References Cited

U.S. PATENT DOCUMENTS

| | | | | |
|---|---|---|---|---|
| 6,231,883 B1 * | 5/2001 | Inosaka | ............... | A61L 15/58 |
| | | | | 424/443 |
| 6,291,636 B1 * | 9/2001 | Miyake | ............... | A61L 15/225 |
| | | | | 528/502 C |
| 2002/0164446 A1 * | 11/2002 | Zhou | ............... | A61L 15/58 |
| | | | | 428/40.1 |
| 2003/0113548 A1 | 6/2003 | Corzani et al. | | |
| 2004/0033362 A1 * | 2/2004 | Mino | ............... | C08J 9/32 |
| | | | | 428/411.1 |
| 2006/0216523 A1 | 9/2006 | Takaki | | |
| 2008/0233348 A1 * | 9/2008 | Ishiwatari | ............... | C09J 7/385 |
| | | | | 428/134 |
| 2015/0265742 A1 | 9/2015 | Nakagawa et al. | | |
| 2018/0010019 A1 | 1/2018 | Han et al. | | |

FOREIGN PATENT DOCUMENTS

| | | |
|---|---|---|
| EP | 1656433 A1 | 5/2006 |
| EP | 2921540 A1 | 9/2015 |
| JP | S5252936 A | 4/1977 |
| JP | H0748554 A | 2/1995 |
| JP | 2011121925 A | 6/2011 |
| KR | 20030028564 A | 4/2003 |
| KR | 100564999 B1 | 3/2006 |
| KR | 100582049 B1 | 5/2006 |
| KR | 101342756 B1 | 12/2013 |
| KR | 20150108771 A | 9/2015 |

OTHER PUBLICATIONS

Search report from International Application No. PCT/KR2017/002013, dated Jun. 15, 2017.
Extended European Search Report for Application No. EP17756830 dated Mar. 21, 2018.
Chinese Search Report for Application No. CN 201780001702.3 dated Dec. 18, 2019, 2 pages.

\* cited by examiner

[Figure 1]
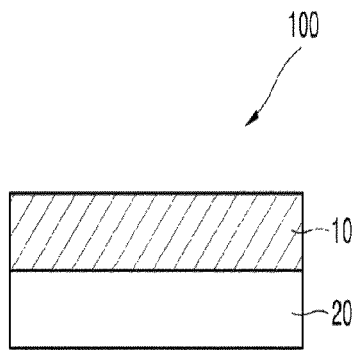
[Figure 2]
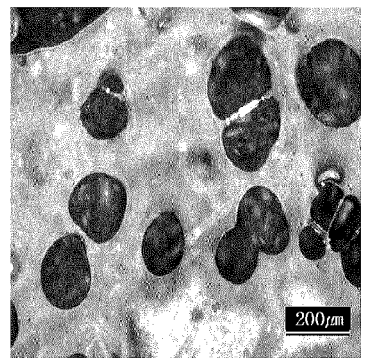

ADHESIVE TAPE AND METHOD OF MANUFACTURING THEREOF

CROSS-REFERENCE TO RELATED APPLICATIONS

The present application is a national phase entry under 35 U.S.C. § 371 of International Application No. PCT/KR2017/002013 filed Feb. 23, 2017, which claims priority from Korean Patent Application No. 10-2016-0021422 filed in the Korean Intellectual Property Office on Feb. 23, 2016, the entire contents of which are incorporated herein by reference.

TECHNICAL FIELD

The present specification claims priority to and the benefit of Korean Patent Application No. 10-2016-0021422 filed in the Korean Intellectual Property Office on Feb. 23, 2016, the entire contents of which are incorporated herein by reference.

The present invention relates to an adhesive tape and a method of manufacturing thereof.

BACKGROUND ART

When an adhesive tape is used for medical applications, the adhesive tape is used in the form of a first-aid adhesive tape, a surgical tape, and the like. The adhesive tape includes a base material and an adhesive sheet formed on the base material, and the adhesive sheet is adhered on the surface of the skin when used for medical applications.

A general adhesive tape is manufactured by applying an adhesive composition onto a base film. When the general adhesive tape is used for medical applications, there are problems in that the tape has no breathability and thus has a low water vapor transmission rate, it is difficult for perspiration to be emitted when the tape is attached onto the skin, and skin maceration occurs.

Specifically, the adhesive tape includes a base material and an adhesive sheet formed from an adhesive composition on the base material. As the adhesive composition, an acrylic adhesive composition is generally frequently used, but it is difficult for the composition itself to have a high water vapor transmission rate of 3,000 g/m$^2$·day or more. Therefore, when an adhesive tape is used for medical applications and attached onto the skin for a long period of time, the adhesive tape has no breathability and thus has a low water vapor transmission rate, and as a result, moisture and the like generated from the skin fail to be emitted, and skin maceration may occur.

In order to solve the problems, an adhesive tape having pores is manufactured by allowing an adhesive composition to include a resin and a foaming agent and be foamed, but the manufacturing method has a limitation in improving the water vapor transmission rate.

CITATION LIST

Patent Document (Patent Document 1) Korean Patent No. 10-0564999

DETAILED DESCRIPTION OF THE INVENTION

Technical Problem

The present invention has been made in an effort to provide an adhesive tape having an excellent water vapor transmittance.

The present invention has also been made in an effort to provide a method for manufacturing the adhesive tape.

Technical Solution

An exemplary embodiment of the present invention provides an adhesive tape including: a base material; and an adhesive sheet provided on one surface of the base material and including cured products of an aqueous acrylic adhesive composition, in which the adhesive sheet has a porous structure including pores, and wherein the adhesive tape has a water vapor transmission rate of 3,000 g/m$^2$·day or more and 5,000 g/m$^2$·day or less under conditions of a temperature of 40° C. and a relative humidity of 20%.

Another exemplary embodiment of the present invention provides a method for manufacturing the adhesive tape.

Still another exemplary embodiment of the present invention provides a method for manufacturing an adhesive tape, the method comprising: (a) applying an aqueous acrylic adhesive composition onto a release film; (b) forming an adhesive sheet on the release film by carrying out foaming and thermal curing the applied adhesive composition sequentially at a first temperature (T1), a second temperature (T2), a third temperature (T3), and a fourth temperature (T4); (c) attaching a base material onto the adhesive sheet; (d) aging the product obtained from step (c); and (e) removing the release film and winding the base material provided with the adhesive sheet, after the aging step.

Advantageous Effects

An adhesive tape according to the present invention has an advantage in that the adhesive tape has excellent water vapor transmittance due to a porous structure including pores.

When the adhesive tape according to the present invention is used for medical applications, there are advantages in that perspiration is easily emitted and skin maceration may be prevented.

The adhesive tape according to the present invention uses an aqueous acrylic adhesive sheet, and thus, has an advantage in that low irritability to the skin is secured when the adhesive tape is used for medical applications as compared to the case where a rubber-based adhesive sheet is used.

A method for manufacturing an adhesive tape according to the present invention has an advantage in that the foaming efficiency and water vapor transmission rate of the adhesive tape may be improved by adjusting the temperature of foaming and thermal curing and the aging temperature.

The method for manufacturing an adhesive tape according to the present invention has an advantage in that the adhesive sheet is settled on the base material in the aging step, so that the water vapor transmission rate may be partially increased, and pores are additionally formed in the adhesive sheet during the process of winding the adhesive tape after the aging step, and then unwinding the wound adhesive tape, so that the water vapor transmission rate of the adhesive tape may be additionally increased.

BRIEF DESCRIPTION OF DRAWINGS

FIG. 1 is a schematic cross-sectional view illustrating an adhesive tape according to the present invention.

FIG. 2 is a photograph illustrating a surface shape of an adhesive tape manufactured by a method according to an Example.

EXPLANATION OF REFERENCE NUMERALS AND SYMBOLS

10: Adhesive sheet
20: Base material
100: Adhesive tape

BEST MODE

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

Hereinafter, the present specification will be described in more detail.

An exemplary embodiment of the present invention provides an adhesive tape including: a base material; and an adhesive sheet provided on one surface of the base material and including cured products of an aqueous acrylic adhesive composition, in which the adhesive sheet has a porous structure including pores, and wherein the adhesive tape has a water vapor transmission rate of 3,000 g/m²·day or more and 5,000 g/m²·day or less under conditions of a temperature of 40° C. and a relative humidity of 20%.

According to an exemplary embodiment of the present invention, the base material may be formed of an organic fiber or inorganic fiber material fabric, paper, and the like.

According to an exemplary embodiment of the present invention, the adhesive tape may secure a high water vapor transmission rate by a porous structure including pores.

According to an exemplary embodiment of the present invention, the porous structure may include a plurality of pores, and the plurality of pores may be classified into, for example, two forms of closed pores or opened pores.

According to an exemplary embodiment of the present invention, the porous structure may be a structure including each of the closed pores and the opened pores, or including both the closed pores and the opened pores. The closed pores are pores which are formed of a structure in which the wall surfaces of pores are all closed, and thus are not connected to other pores, and are also referred to closed cells. The opened pores are pores which are formed of a structure in which at least a portion of the wall surfaces of pores are open, and thus are connected to other pores, and are also referred to opened cells. The opened pores may be formed as in a process where an adhesive composition is foamed, a gas generated from a thermal foaming agent in the adhesive composition forms a bubble, and the bubble is continuously grown and then ruptured. Specifically, as the bubble is grown, the opened pores may be formed while as adjacent bubbles and the bubble wall surfaces separating the adjacent bubbles between the adjacent bubbles become gradually thin, the bubbles are ruptured due to the bursting or tearing of the bubble wall surfaces, and the like.

According to an exemplary embodiment of the present invention, the pores may have a size of 0.5 μm or more and 200 μm or less, and specifically, 100 μm or more and 150 μm or less. When the pores have a size less than 0.5 μm, the water vapor transmission rate effects are insufficient, and when the pores have a size more than 20 μm, the surface shape of the adhesive sheet becomes irregular, and as a result, adhesive physical properties may deteriorate. Further, since the pores are formed to have the size within the range, the air or moisture may easily pass through the pores, wound sites may be effectively protected by preventing the infiltration of various foreign substances, and the like from the outside, and the water vapor transmission rate of the adhesive tape may be improved.

In the present specification, the size of pore may mean the maximum diameter of pore. The maximum diameter may mean the maximum length of both ends of a particle.

In the present specification, the size of pore may mean the average diameter of pores. The average diameter is a representative diameter of a particle group having two or more particle diameters, and the calculation method thereof may mean an arithmetic average diameter.

According to an exemplary embodiment of the present invention, the adhesive sheet may have a thickness of 10 μm or more and 100 μm or less. Within the thickness range, the adhesive sheet may exhibit excellent adhesion properties. Furthermore, when an adhesive tape including an adhesive sheet within the thickness range is used for medical applications, the adhesive tape may serve to sufficiently protect wounds or affected parts. When the adhesive sheet has a thickness less than 10 μm, it is difficult to adjust physical properties of the adhesive tape, and the surface shape of the adhesive sheet caused by pores may not be smooth. When the thickness is more than 100 μm, only the thickness of the adhesive sheet is increased, but there may not be an effect more than the increase in thickness.

According to an exemplary embodiment of the present invention, an area ratio of pores to the adhesive sheet may be 10% or more and 60% or less, and specifically 30% or more and 60% or less, based on a unit area of 10 cm×10 cm. The water vapor transmission rate of the adhesive sheet may be improved by including pores at the area ratio within the range.

According to an exemplary embodiment of the present invention, the area ratio of pores to the adhesive sheet may be measured through an image processing program. Specifically, when the image of the adhesive tape is analyzed, the pores and the adhesive sheet on the adhesive tape may be differentiated from each other due to the difference in brightness and darkness between the pores and the adhesive sheet, so that the area ratio of pores per unit area may be measured by defining a relatively dark portion as the pores and a bright portion as the adhesive sheet.

According to an exemplary embodiment of the present invention, the aqueous acrylic adhesive composition may have a density of 0.4 g/cm³ or more and 0.8 g/cm³ or less. When the adhesive tape includes cured products of an aqueous acrylic adhesive composition having the density within the range, an adhesive strength appropriate to be used for medical applications may be secured.

According to an exemplary embodiment of the present invention, the aqueous acrylic adhesive composition may include: an acrylic resin; and one or more additives selected from the group consisting of a thermal foaming agent, a curing agent, and a surfactant.

According to an exemplary embodiment of the present invention, a content of the thermal foaming agent may be 0.2 part by weight or more and 1 part by weight or less based on 100 parts by weight of the acrylic resin.

According to an exemplary embodiment of the present invention, a content of the curing agent may be 1 part by weight or more and 5 parts by weight or less based on 100 parts by weight of the acrylic resin.

According to an exemplary embodiment of the present invention, the gelation of the aqueous acrylic adhesive composition may easily proceed without a separate cross-linking agent when the aqueous acrylic adhesive composition is thermally cured.

According to an exemplary embodiment of the present invention, the adhesive tape may be used for medical applications due to the excellent water vapor transmittance, moisture and the like emitted from the skin may be easily emitted when the adhesive tape is attached onto the skin for a long period of time, and a low irritant effect may be provided due to excellent adhesion characteristics when the adhesive tape is peeled off.

According to an exemplary embodiment of the present invention, the acrylic resin may be a polymer of a (meth) acrylic acid ester-based monomer and a polar functional group-containing monomer.

According to an exemplary embodiment of the present invention, a content of the surfactant may be 35 parts by weight or more and 50 parts by weight or less based on 100 parts by weight of the polar functional group-containing monomer.

According to an exemplary embodiment of the present invention, a content of the polar functional group-containing monomer may be 0.7 part by weight or more and 2 parts by weight or less, 1 part by weight or more and 1.8 parts by weight or less, and more specifically, 1.5 parts by weight or more and 1.8 parts by weight or less, based on 100 parts by weight of the (meth)acrylic acid ester-based monomer. The acrylic resin includes the (meth)acrylic acid ester-based monomer and the polar functional group-containing monomer in the contents within the ranges, so that an adhesive tape including the acrylic resin may have an appropriate adhesive strength and simultaneously a high water vapor transmission rate value.

According to an exemplary embodiment of the present invention, the acrylic resin may have a weight average molecular weight of 10,000,000 g/mol or more. Since an adhesive tape including an acrylic resin having the weight average molecular weight within the range may sufficiently secure pores caused by a foaming agent, the adhesive tape may secure a high water vapor transmission rate value.

According to an exemplary embodiment of the present invention, the (meth)acrylic acid ester-based monomer may use alkyl (meth)acrylate. In this case, when an alkyl group included in the monomer becomes an excessively long chain, it is possible to use an alkyl (meth)acrylic acid ester-based monomer including a branched alkyl group having 1 to 22 carbon atoms because there is a concern in that cohesive strength of the adhesive composition is decreased and it is difficult to adjust the glass transition temperature (Tg) and adhesion properties. Specifically, the (meth)acrylic acid ester-based monomer may include one or more selected from the group consisting of methyl (meth) acrylate, ethyl (meth)acrylate, isopropyl (meth)acrylate, n-butyl (meth)acrylate, t-butyl (meth)acrylate, sec-butyl (meth)acrylate, 2-ethylhexyl (meth)acrylate, 2-ethylbutyl (meth)acrylate, isooctyl (meth)acrylate, and isononyl (meth) acrylate.

According to an exemplary embodiment of the present invention, the polar functional group-containing monomer includes a polar functional group capable of being copolymerized with the (meth)acrylic acid ester-based monomer, and thus serves to adjust the durability and reliability and cohesive strength of the adhesive composition. Specifically, the polar group-containing monomer may include one or more selected from the group consisting of a hydroxy group-containing monomer, a carboxyl group-containing monomer, and a nitrogen-containing monomer, but is not limited thereto.

According to an exemplary embodiment of the present invention, the hydroxy group-containing monomer may include one or more selected from the group consisting of hydroxyethyl (meth)acrylate, 4-hydroxybutyl (meth)acrylate, 5-hydroxypentyl (meth)acrylate, 6-hydroxyhexyl (meth)acrylate, 10-hydroxydecyl (meth)acrylate, N-hydroxyethyl (meth)acrylate, 2-hydroxypropyl (meth)acrylate, and 2-hydroxy-3-propyl (meth)acrylate, but is not limited thereto.

According to an exemplary embodiment of the present invention, the carboxyl group-containing monomer may include one or more selected from the group consisting of acrylic acid, methacrylic acid, crotonic acid, maleic acid, anhydrous maleic acid, itaconic acid, fumaric acid, glycolic acid, an acrylic acid dimer, a methacrylic acid dimer, an acrylic acid trimer, an acrylic acid tetramer, a methacrylic acid tetramer, 2-acryloyloxyethyl succinic acid monoester, and 2-acryloyloxyethyl phthalic acid monoester, but is not limited thereto.

According to an exemplary embodiment of the present invention, the nitrogen-containing monomer may include one or more selected from the group consisting of (meth) acrylamide, N-vinylpyrrolidone, and N-vinylcaprolactam, but is not limited thereto.

According to an exemplary embodiment of the present invention, the surfactant may include one or more selected from the group consisting of a cationic surfactant, an anionic surfactant, a zwitterionic surfactant, and a non-ionic surfactant.

According to an exemplary embodiment of the present invention, the surfactant may include one or more selected from the group consisting of alkyl sulfate, alkyl aryl sulfate, alkyl aryl sulfonate, phosphate, alpha olefin sulfonate, ammonium laureth sulfate, ammonium laureth ether sulfate, ammonium stearate, sodium laureth sulfate, sodium octyl sulfate, sodium tridecyl ether sulfate, triethanolamine lauryl sulfate, disodium oleate, alkyl ether sulfate, sodium trioxyethylene lauryl ether sulfate (SLES), and N,N-dimethyl lauryl amine oxide.

According to an exemplary embodiment of the present invention, the surfactant may include one or more selected from the group consisting of a silicone-based surfactant and a fluorine-based surfactant. Bubbles may be more easily dissolved in the aqueous acrylic adhesive composition by including the kind of surfactant.

According to an exemplary embodiment of the present invention, the thermal foaming agent may not include an inorganic foaming agent. The inorganic foaming agent may be decomposed only when a heat treatment is carried out at a high temperature of about 200° C. for about 10 minutes or less, and as a result, the inorganic foaming agent may damage an acrylic resin.

According to an exemplary embodiment of the present invention, the thermal foaming agent may include an organic foaming agent. Specifically, the thermal foaming agent may include one or more selected from the group consisting of azo dicarbon amide, p,p'-oxybis(benzenesulfonyl hydrazide), p-toluenesulfonyl hydrazide, and sodium bicarbonate. Since the thermal foaming agent may be decomposed by carrying out a heat treatment at a high temperature of about 150° C. to about 180° C. for about 10 minutes or less, an adhesive tape including the thermal foaming agent may cause foaming by releasing gas such as nitrogen while preventing an acrylic resin from being damaged.

According to an exemplary embodiment of the present invention, the aqueous acrylic adhesive composition may adjust peeling force of the adhesive sheet by using a curing agent, and may provide enough adhesion properties but not to cause skin irritation.

According to an exemplary embodiment of the present invention, the curing agent may include a zinc oxide curing agent, but is not limited thereto.

According to an exemplary embodiment of the present invention, the aqueous acrylic adhesive composition may further include an additive including one or more selected from the group consisting of a thickener, a molecular weight adjusting agent, an emulsifier, a tackifier, and an aqueous ammonia solution, but is not limited thereto.

According to an exemplary embodiment of the present invention, the aqueous ammonia solution may be used as a stabilizer of the aqueous acrylic adhesive composition, and thus may be included in the composition in order to adjust the viscosity, and the like.

According to an exemplary embodiment of the present invention, the adhesive tape may be an adhesive tape for medical applications.

Another exemplary embodiment of the present invention provides a method for manufacturing the adhesive tape.

Still another exemplary embodiment of the present invention provides a method for manufacturing an adhesive tape, the method comprising: (a) applying an aqueous acrylic adhesive composition onto a release film; (b) forming an adhesive sheet on the release film by carrying out foaming and thermal curing the applied adhesive composition sequentially at a first temperature (T1), a second temperature (T2), a third temperature (T3), and a fourth temperature (T4); (c) attaching a base material onto the adhesive sheet; (d) aging the product obtained from step (c); and (e) removing the release film and winding the base material provided with the adhesive sheet, after the aging step.

According to an exemplary embodiment of the present invention, the method for manufacturing an adhesive tape may further include: unwinding the product obtained from step (e).

According to an exemplary embodiment of the present invention, in step (e), the winding of the base material provided with the adhesive sheet may mean an action of winding the base material including the adhesive sheet on one surface thereof in the form of a roll. Specifically, the other surface of the base material may be brought into contact with an upper surface of the adhesive sheet through the winding.

According to an exemplary embodiment of the present invention, the unwinding of the product in step (e) may mean an action of unwinding the base material provided with the adhesive sheet, which is wound in the form of a roll, and more specifically, unwinding the adhesive tape in the form of a roll, and then making the adhesive tape a form of an adhesive tape provided with the adhesive sheet on one surface of the base material.

In the present specification, the other surface may mean a surface at a side opposite to one surface of the base material provided with the adhesive sheet when the adhesive tape is unwound.

According to an exemplary embodiment of the present invention, the release film may be a thermoplastic plastic film, for example, a polyethylene terephthalate (PET) film, but is not limited thereto.

According to an exemplary embodiment of the present invention, the first temperature may be 0° C. or more and 30° C. or less. Within the first temperature range, the thermal curing reaction may be appropriately carried out while evaporating a solvent included in the applied aqueous acrylic adhesive composition. When the first temperature is more than 30° C., it may be difficult for opened pores to be formed while the surface of the adhesive sheet is rapidly dried.

According to an exemplary embodiment of the present invention, the second temperature may be 150° C. or more and 200° C. or less. Within the second temperature range, the thermal foaming agent is sufficiently decomposed, so that foaming and thermal curing may be effectively carried out.

According to an exemplary embodiment of the present invention, the third temperature may be 90° C. or more and 120° C. or less. After the thermal foaming agent is sufficiently decomposed by the second temperature, the temperature is lowered within the third temperature range, thereby smoothly carrying out the foaming and thermal curing reactions while effectively preventing the acrylic resin from being damaged.

According to an exemplary embodiment of the present invention, the fourth temperature may be 40° C. or more and 80° C. or less. Within the fourth temperature range, the foaming and thermal curing reactions may be sufficiently carried out.

According to an exemplary embodiment of the present invention, the foaming and thermal curing may be carried out for about 1 minute or more and about 10 minute or less at the first temperature, the second temperature, the third temperature, and the fourth temperature, respectively. By adjusting the time when the foaming and thermal curing are carried out at the respective temperatures, the thermal foaming agent is sufficiently decomposed, thereby easily initiating the foaming. Further, an adhesive sheet having a porous structure may be formed by minimizing the damage to the acrylic resin.

According to an exemplary embodiment of the present invention, the aging may be carried out at a temperature of 40° C. or more and 60° C. or less. When the temperature is out of the aging temperature range, it may be difficult for pores to be additionally formed in the adhesive sheet. Specifically, when the aging is carried out at a temperature more than 60° C., defects of the adhesive tape may occur because the base material and the adhesive sheet may be adhered to each other.

According to an exemplary embodiment of the present invention, the aging may be carried out for 20 hours or more and 30 hours or less. When the aging time is out of the aging time range, it is difficult for pores to be additionally formed in the adhesive sheet. Specifically, when the aging is carried out for 30 hours or more, defects of the adhesive tape may occur because the base material and the adhesive sheet may be adhered to each other.

According to an exemplary embodiment of the present invention, a base material, an adhesive sheet, a base material, and an adhesive sheet may be stacked in this order in the adhesive tape through the winding of the base material provided with the adhesive sheet. Further, through the winding step, the adhesive sheet is settled on the base material during the process of manufacturing the adhesive tape, and the water vapor transmission rate of the adhesive tape may be improved. Furthermore, in the unwinding of the product obtained from the winding step, pores may be additionally formed in the adhesive sheet through the process of peeling off the adhesive sheet brought into contact with the other surface of the base material, and the water vapor transmission rate of the adhesive tape may be additionally increased through the additional formation of pores.

The adhesive tape according to an exemplary embodiment of the present invention may be distributed in the form of being wound, and the adhesive tape distributed in the form of being wound may be unwound and used when a user uses the adhesive tape, and as a result, an adhesive tape with a water vapor transmission rate increased may be used.

The adhesive tape according to an exemplary embodiment of the present invention may be distributed in a state where an unwound form thereof is hermetically sealed.

According to an exemplary embodiment of the present invention, the aqueous acrylic adhesive composition may include an acrylic resin, a thermal foaming agent, a curing agent, and a surfactant, and the contents on each of the acrylic resin, the thermal foaming agent, the curing agent, and the surfactant are the same as those described above.

FIG. 1 is a schematic cross-sectional view illustrating an adhesive tape according to the present invention.

Referring to FIG. 1, an adhesive tape 100 according to the present invention includes a base material 20 and an adhesive sheet 10.

MODE FOR INVENTION

Hereinafter, the present invention will be described in detail with reference to Examples for specifically describing the present invention. However, the Examples according to the present invention may be modified in various forms, and it is not interpreted that the scope of the present invention is limited to the Examples to be described below. The Examples of the present specification are provided for more completely explaining the present invention to the person with ordinary skill in the art.

Examples

An acrylic resin having a weight average molecular weight of 10,000,000 g/mol was obtained by copolymerizing acrylic acid (AA), methyl (meth)acrylate (MMA), ethylhexyl acrylate (EHA), ethyl acrylate (EA), butyl acrylate (BA), water, and a poly(ethylene glycol)nonylphenyl tetraammonium sulfate emulsifier. The content of each component is shown in the following [Table 1].

TABLE 1

| | AA | MMA | EHA | EA | BA | Emulsifier | Water |
|---|---|---|---|---|---|---|---|
| Content (wt %) based on 100 wt % of acrylic resin | 1 | 5 | 40 | 3 | 8 | 1 | 42 |

Prepared was an aqueous acrylic adhesive composition including 0.9 part by weight of p,p'-oxybis (benzenesulfonyl hydrazide) as a foaming agent based on 100 parts by weight of the acrylic resin, 1.2 parts by weight of N,N-dimethyl-laurylamine oxide as a surfactant based on 100 parts by weight of the acrylic resin, and 35 parts by weight of zinc oxide as a curing agent based on 100 parts by weight of the acrylic acid.

After the adhesive composition was applied onto a release film formed of a PET material, foaming and thermal curing were carried out at a first temperature (T1), a second temperature (T2), a third temperature (T3), and a fourth temperature (T4), thereby forming an adhesive sheet having a thickness of 100 μm and including a porous structure on the release film.

A base material formed of a paper material was attached onto the adhesive sheet, and then aged, the release film was removed, and the adhesive sheet and the base material were wound.

Thereafter, the wound adhesive sheet and the wound base material were unwound, thereby manufacturing an adhesive tape.

Comparative Examples

Adhesive tapes were manufactured in the same manner as in the Example, except that the first to fourth temperatures, the temperature and time during the aging, and whether to manufacture the wound structure were varied.

The foaming and thermal curing conditions and the aging conditions in the Example and the Comparative Examples are shown in the following [Table 2].

TABLE 2

| | Foaming and thermal curing (° C.) $T_1/T_2/T_3/T_4$ | Aging temperature (° C.)/time (h) | Whether to manufacture wound structure | Water vapor transmission rate (g/m$^2$ · day) |
|---|---|---|---|---|
| Example | 25/165/100/60 | 50/24 | o | 3500 |
| Comparative Example 1 | 25/165/100/60 | 50/24 | x | 2000 |
| Comparative Example 2 | 25/165/100/60 | 50/48 | o | 1500 |
| Comparative Example 3 | 40/165/100/60 | 50/24 | o | 1000 |
| Comparative Example 4 | 80/165/100/60 | 50/24 | o | 1200 |
| Comparative Example 5 | 80/165/100/60 | — | x | 700 |

Measurement of Water Vapor Transmission Rate

The water vapor transmission rate was measured by a water method in accordance with the ASTM E96 conditions. Specifically, a circular sample having a diameter of 46 mm was prepared by cutting each adhesive sheet, an initial weight being a weight before each sample was put into a constant temperature and constant humidity chamber was measured, a post weight being a weight after each sample was left to stand for 24 hours under conditions of a temperature of 40° C. and a relative humidity of 20% in the constant temperature and constant humidity chamber was measured, and then a water vapor transmission rate was calculated by the following Equation 1.

Water vapor transmission rate(g/m$^2$·day)=(initial weight−post weight)/area [Equation 1]

Measurement of Average Size in Pores

The surface of the adhesive tape manufactured according to the Example was photographed by using an optical microscope (manufactured by Huvitz Co., Ltd., HRM300, 10× objective lens), and the surface is illustrated in FIG. 2. The size of pores shown on the surface of the adhesive tape was calculated as an arithmetic average diameter by using an image processing program.

Evaluation

Referring to Table 2, in the case of the Example which satisfies all of the foaming and thermal curing conditions, the conditions of manufacturing a roll form, and the aging conditions according to an exemplary embodiment of the present invention, the result of a water vapor transmission rate of 3,500 g/m²·day is shown.

Further, since the Example including the process of manufacturing the wound structure exhibited a higher water vapor transmission rate result than that of Comparative Example 1 including no process of manufacturing the wound structure, it could be confirmed that the process of manufacturing the wound structure contributed to an improvement in water vapor transmission rate.

In contrast, since Comparative Examples 2 to 5 did not satisfy the foaming thermal curing conditions, the conditions of manufacturing the wound structure, or the aging conditions according to an exemplary embodiment of the present invention, Comparative Examples 2 to 5 exhibited relatively lower water vapor transmission rates than that of the Example. Therefore, it could be confirmed that an adhesive tape having a high water vapor transmission rate could be manufactured only when all the conditions of manufacturing an adhesive tape according to an exemplary embodiment of the present invention are satisfied.

Further, for the adhesive tape of the Example, the average size of pores satisfied a range of 0.5 μm or more and 200 μm or less. FIG. 2 illustrates a surface shape of the adhesive tape of the Example, and it could be confirmed that the adhesive tape of the present invention had a porous structure including pores having a size of 0.5 μm or more and 200 μm or less.

The invention claimed is:

1. An adhesive tape comprising:
a base material; and
an adhesive sheet provided on one surface of the base material and comprising cured products of an aqueous acrylic adhesive composition,
wherein the adhesive sheet has a porous structure comprising pores,
wherein the adhesive tape has a water vapor transmission rate of 3,000 g/m²·day or more and 5,000 g/m²·day or less under conditions of a temperature of 40° C. and a relative humidity of 20%,
wherein the aqueous acrylic adhesive composition comprises an acrylic resin, a thermal foaming agent, a curing agent and a surfactant, wherein the thermal foaming agent includes one or more selected from the group consisting of azo dicarbon amide, p,p'-oxybis (benzenesulfonyl hydrazide), p-toluenesulfonyl hydrazide, and sodium bicarbonate, wherein the surfactant includes one or more of a cationic surfactant, a zwitterionic surfactant, or a non-ionic surfactant, wherein a content of the thermal foaming agent is 0.2 parts by weight or more and 1 part by weight or less based on 100 parts by weight of acrylic resin, wherein the acrylic resin is a polymer of a (meth)acrylic acid ester-based monomer and a polar functional group-containing monomer, wherein a content of the polar functional group-containing monomer is 0.7 part by weight or more and 2 parts by weight or less based on 100 parts by weight of the (meth)acrylic acid ester-based monomer, wherein the acrylic resin has a weight average molecular weight of 10,000,000 g/mol or more, and
wherein the adhesive sheet is formed by carrying out foaming and thermal curing the aqueous acrylic adhesive composition sequentially at a first temperature (T1) of 0° C. or more and 30° C. or less, a second temperature (T2) of 150° C. or more and 200° C. or less, a third temperature (T3) of 90° C. or more and 120° C. or less, and a fourth temperature (T4) of 40° C. or more and 80° C. or less.

2. The adhesive tape of claim 1, wherein the pores have a size of 0.5 μm or more and 200 μm or less.

3. The adhesive tape of claim 1, wherein the adhesive sheet has a thickness of 10 μm or more and 100 μm or less.

4. The adhesive tape of claim 1, wherein an area ratio of pores to the adhesive sheet is 10% or more and 60% or less based on a unit area of 10 cm×10 cm.

5. The adhesive tape of claim 1, wherein the curing agent comprises a zinc oxide curing agent.

6. The adhesive tape of claim 5, wherein a content of the curing agent is 1 part by weight or more and 5 parts by weight or less based on 100 parts by weight of the acrylic resin.

7. An adhesive tape comprising:
a base material; and
an adhesive sheet provided on one surface of the base material and comprising cured products of an aqueous acrylic adhesive composition, wherein the adhesive tape is formed by the base material and the adhesive sheet undergoing a winding and unwinding process,
wherein the adhesive sheet has a porous structure comprising pores, and
wherein the adhesive tape has a water vapor transmission rate of 3,000 g/m²·day or more and 5,000 g/m²·day or less under conditions of a temperature of 40° C. and a relative humidity of 20%,
wherein the aqueous acrylic adhesive composition comprises an acrylic resin, a thermal foaming agent, a curing agent and a surfactant, wherein the thermal foaming agent includes one or more selected from the group consisting of azo dicarbon amide, p,p'-oxybis (benzenesulfonyl hydrazide), p-toluenesulfonyl hydrazide, and sodium bicarbonate, wherein the surfactant includes one or more of a cationic surfactant, a zwitterionic surfactant, or a non-ionic surfactant,
wherein the adhesive sheet is formed by carrying out foaming and thermal curing the aqueous acrylic adhesive composition sequentially at a first temperature (T1) of 0° C. or more and 30° C. or less, a second temperature (T2) of 150° C. or more and 200° C. or less, a third temperature (T3) of 90° C. or more and 120° C. or less, and a fourth temperature (T4) of 40° C. or more and 80° C. or less.

8. An adhesive tape comprising:
a base material; and
an adhesive sheet provided on one surface of the base material and comprising cured products of an aqueous acrylic adhesive composition,
wherein the adhesive sheet has a porous structure comprising pores, and
wherein the adhesive tape has a water vapor transmission rate of 3,000 g/m²·day or more and 5,000 g/m²·day or less under conditions of a temperature of 40° C. and a relative humidity of 20%,
wherein the aqueous acrylic adhesive composition comprises an acrylic resin, a thermal foaming agent, a curing agent and a surfactant, wherein the thermal foaming agent includes one or more selected from the group consisting of azo dicarbon amide, p,p'-oxybis (benzenesulfonyl hydrazide), p-toluenesulfonyl hydrazide, and sodium bicarbonate, wherein the surfactant includes one or more of a cationic surfactant, a zwitterionic surfactant, or a non-ionic surfactant, wherein a content of the thermal foaming agent is 0.2 parts by weight or more and 1 part by weight or less based on 100 parts by weight of acrylic resin, wherein the acrylic resin is a polymer of a (meth)acrylic acid ester-based monomer and a polar functional group-containing monomer, wherein a content of the polar functional group-containing monomer is 0.7 part by weight or more and 2 parts by weight or less based on 100 parts by weight of the (meth)acrylic acid ester-based monomer, wherein the aqueous acrylic adhesive composition has a density of 0.4 g/cm$^3$ or more and 0.8 or less g/cm$^3$, wherein the adhesive sheet is formed by carrying out foaming and thermal curing the aqueous acrylic adhesive composition sequentially at a first temperature (T1) of 0° C. or more and 30° C. or less, a second temperature (T2) of 150° C. or more and 200° C. or less, a third temperature (T3) of 90° C. or more and 120° C. or less, and a fourth temperature (T4) of 40° C. or more and 80° C. or less.

9. The adhesive tape of claim 8, wherein the pores have a size of 0.5 μm or more and 200 μm or less.

10. The adhesive tape of claim 8, wherein an area ratio of pores to the adhesive sheet is 10% or more and 60% or less based on a unit area of 10 cm×10 cm.

11. A method for manufacturing the adhesive tape of claim 1, comprising:
 (a) applying the aqueous acrylic adhesive composition onto a release film;
 (b) forming the adhesive sheet on the release film by carrying out foaming and thermal curing the applied adhesive composition sequentially at the first temperature (T1), the second temperature (T2), the third temperature (T3), and the fourth temperature (T4);
 (c) attaching the base material onto the adhesive sheet;
 (d) aging the product obtained from step (c); and
 (e) removing the release film and winding the base material provided with the adhesive sheet, after the aging step.

12. The method of claim 11, further comprising:
 unwinding the product obtained from in step (e).

13. The method of claim 11, wherein the aging step is carried out at a temperature of 40° C. or more and 60° C. or less.

14. The method of claim 11, wherein the aging step is carried out for a period of time of 20 hours or more and 30 hours or less.

* * * * *